(12) United States Patent
Johnson et al.

(10) Patent No.: US 11,683,977 B2
(45) Date of Patent: *Jun. 20, 2023

(54) SUBSTRATE INCLUDING A SELF-SUPPORTING TRI-LAYER STACK

(71) Applicant: 3M INNOVATIVE PROPERTIES COMPANY, St. Paul, MN (US)

(72) Inventors: Stephen A. Johnson, Woodbury, MN (US); Derek W. Patzman, Savage, MN (US); Richard Y. Liu, Woodbury, MN (US); John F. Van Derlofske, III, Minneapolis, MN (US); Kristopher J. Derks, Woodbury, MN (US); Victor Ho, St. Paul, MN (US); Kevin T. Huseby, Oakdale, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/733,110

(22) PCT Filed: Nov. 19, 2018

(86) PCT No.: PCT/US2018/061731
§ 371 (c)(1),
(2) Date: May 19, 2020

(87) PCT Pub. No.: WO2019/108423
PCT Pub. Date: Jun. 6, 2019

(65) Prior Publication Data
US 2020/0348780 A1 Nov. 5, 2020

Related U.S. Application Data

(60) Provisional application No. 62/592,555, filed on Nov. 30, 2017.

(51) Int. Cl.
*H10K 77/10* (2023.01)
*B32B 27/36* (2006.01)
(Continued)

(52) U.S. Cl.
CPC ............ *H10K 77/111* (2023.02); *B32B 27/08* (2013.01); *B32B 27/36* (2013.01); *G06F 3/041* (2013.01);
(Continued)

(58) Field of Classification Search
None
See application file for complete search history.

(56) References Cited

U.S. PATENT DOCUMENTS 5,331,082 A * 7/1994 Mossman ............ C08G 63/189
528/308
5,380,577 A * 1/1995 Hamano ............ G11B 5/73929
428/143
(Continued)

FOREIGN PATENT DOCUMENTS

EP 437942 7/1991
EP 0 785 067 A * 7/1997
(Continued)

OTHER PUBLICATIONS

International Search Report for PCT International Application No. PCT/US2018/061731, dated May 30, 2019, 4 pages.
(Continued)

*Primary Examiner* — Vivian Chen
(74) *Attorney, Agent, or Firm* — Clifton F. Richardson

(57) ABSTRACT

A substrate including a self-supporting tri-layer stack is described. The tri-layer stack includes first and second outer layers and a biaxially oriented layer disposed between and in direct contact with the first and second outer layers. The biaxially oriented layer may include a first polyester having
(Continued)

greater than 45 mole percent naphthalate units and greater than 45 mole percent ethylene units. Each of the first and second outer layers includes a second polyester which may include 40 to 50 mole percent naphthalate units, at least 25 mole percent ethylene units, and 10 to 25 mole percent of branched or cyclic C4-C10 alkyl units.

20 Claims, 2 Drawing Sheets

(51) Int. Cl.
*G06F 3/041* (2006.01)
*B32B 27/08* (2006.01)
*H10K 50/00* (2023.01)
*B32B 7/023* (2019.01)

(52) U.S. Cl.
CPC .............. *H10K 50/00* (2023.02); *B32B 7/023* (2019.01); *B32B 2250/03* (2013.01); *B32B 2250/244* (2013.01); *B32B 2307/412* (2013.01); *B32B 2307/418* (2013.01); *B32B 2307/42* (2013.01); *B32B 2307/518* (2013.01); *B32B 2307/54* (2013.01); *B32B 2367/00* (2013.01); *B32B 2457/202* (2013.01); *B32B 2457/206* (2013.01); *B32B 2457/208* (2013.01); *G06F 3/0412* (2013.01); *G06F 2203/04103* (2013.01); *Y02E 10/549* (2013.01); *Y10T 428/31786* (2015.04)

(56) References Cited

U.S. PATENT DOCUMENTS

| | | | |
|---|---|---|---|
| 5,466,564 A * | 11/1995 | Blazey | G03C 1/76 355/71 |
| 5,540,868 A * | 7/1996 | Stouffer | C08G 63/80 264/13 |
| 5,567,576 A * | 10/1996 | Suzuki | G03C 1/7954 430/533 |
| 5,837,800 A | 11/1998 | Suzuki | |
| 5,910,363 A * | 6/1999 | Rogers | C08L 67/02 528/307 |
| 5,955,181 A * | 9/1999 | Peiffer | B32B 27/36 428/212 |
| 6,054,212 A * | 4/2000 | Peiffer | C08J 7/043 428/336 |
| 6,120,889 A * | 9/2000 | Turner | C08J 5/18 528/307 |
| 6,139,952 A * | 10/2000 | Furuya | H01H 13/702 428/339 |
| 6,149,995 A * | 11/2000 | Peiffer | B65D 65/38 428/35.8 |
| 6,183,848 B1 * | 2/2001 | Turner | C08J 5/18 528/307 |
| 6,358,579 B1 * | 3/2002 | Peiffer | B32B 27/08 428/35.7 |
| 6,500,506 B1 | 12/2002 | Suzuki | |
| 6,565,936 B1 * | 5/2003 | Peiffer | B32B 27/34 428/35.9 |
| 6,574,045 B2 | 6/2003 | Hebrink | |
| 6,590,044 B2 | 7/2003 | Suzuki | |
| 6,641,900 B2 | 11/2003 | Hebrink | |
| 6,713,185 B2 * | 3/2004 | Carlson, Jr. | B32B 38/1808 156/308.2 |
| 6,817,061 B2 | 11/2004 | Wu | |
| 8,263,731 B2 | 9/2012 | Liu | |
| 8,384,961 B2 | 2/2013 | Cho | |
| 8,865,027 B2 | 10/2014 | Alden | |
| 8,933,906 B2 | 1/2015 | Frey | |
| 9,023,229 B2 | 5/2015 | Sebastian | |
| 9,046,656 B2 | 6/2015 | Liu et al. | |
| 10,067,278 B2 * | 9/2018 | Johnson | C08J 5/18 |
| 10,747,040 B2 * | 8/2020 | Liu | B32B 37/153 |
| 11,016,231 B2 * | 5/2021 | Johnson | G02B 5/3016 |
| 2002/0039235 A1 | 4/2002 | Condo et al. | |
| 2003/0108775 A1 * | 6/2003 | Kobayashi | G11B 5/73931 428/847.2 |
| 2004/0028926 A1 * | 2/2004 | Peiffer | B32B 27/36 428/480 |
| 2004/0219316 A1 | 11/2004 | Takahashi | |
| 2004/0222412 A1 | 11/2004 | Bai et al. | |
| 2004/0265539 A1 * | 12/2004 | Hashimoto | C08J 7/043 428/141 |
| 2005/0019530 A1 | 1/2005 | Merrill et al. | |
| 2005/0084695 A1 * | 4/2005 | Shirane | B32B 27/08 428/483 |
| 2005/0287380 A1 | 12/2005 | Klein | |
| 2006/0084780 A1 * | 4/2006 | Hebrink | B32B 27/36 528/272 |
| 2006/0094858 A1 * | 5/2006 | Turner | C08G 63/20 528/272 |
| 2007/0297736 A1 | 12/2007 | Sherman et al. | |
| 2008/0138597 A1 * | 6/2008 | Asai | C08J 7/042 428/220 |
| 2009/0273836 A1 * | 11/2009 | Yust | B32B 27/36 359/489.04 |
| 2011/0109966 A1 | 5/2011 | Yu et al. | |
| 2011/0109980 A1 * | 5/2011 | Hirokane | C08G 63/189 359/796 |
| 2013/0101816 A1 | 4/2013 | Liu et al. | |
| 2013/0236612 A1 | 9/2013 | Deng et al. | |
| 2014/0142247 A1 * | 5/2014 | Fan | C08K 3/26 524/787 |
| 2014/0242372 A1 * | 8/2014 | Funatsu | C08J 7/042 428/220 |
| 2015/0124194 A1 * | 5/2015 | Oya | G02B 5/305 349/61 |
| 2015/0125709 A1 * | 5/2015 | Fan | B29C 55/16 428/480 |
| 2015/0241925 A1 | 8/2015 | Seo | |
| 2015/0275032 A1 * | 10/2015 | Deak | C08J 7/052 428/195.1 |
| 2015/0316955 A1 | 11/2015 | Dodds | |
| 2016/0282523 A1 * | 9/2016 | Liu | G02B 1/04 |
| 2017/0162734 A1 * | 6/2017 | Parnham | B32B 27/308 |
| 2017/0176658 A1 | 6/2017 | Johnson | |
| 2017/0233525 A1 * | 8/2017 | Kulkarni | C08L 67/02 525/444 |
| 2019/0337274 A1 * | 11/2019 | Puthanparambil | B32B 27/34 |
| 2019/0390093 A1 * | 12/2019 | Ito | C09J 167/02 |

FOREIGN PATENT DOCUMENTS

| | | |
|---|---|---|
| EP | 0785067 A1 * | 7/1997 |
| JP | 09254346 A | 9/1997 |
| JP | 2004-331755 | 11/2004 |
| JP | 2006187880 A | 7/2006 |
| JP | 2007-130997 | 5/2007 |
| JP | 2013129078 A | 7/2013 |
| WO | WO 94-13475 | 6/1994 |
| WO | WO 2006-044075 | 4/2006 |
| WO | WO 2015/125644 A * | 8/2015 |
| WO | WO 2015/129500 A * | 9/2015 |
| WO | WO 2016-196736 | 12/2016 |
| WO | WO 2017-205097 | 11/2017 |
| WO | WO 2019-108425 | 6/2019 |

OTHER PUBLICATIONS

Yu, Display Device Technologies (2$^{nd}$ Edition), National Defense Industry Press of China, Aug. 2014, pp. 237-239,.

* cited by examiner

US 11,683,977 B2

SUBSTRATE INCLUDING A SELF-SUPPORTING TRI-LAYER STACK

BACKGROUND

Substrates are used in various display applications. For example, an emissive layer of a display can be disposed on a substrate. As another example, electrodes of a touch sensor used in a display can be disposed on a substrate.

SUMMARY

In some aspects of the present description, a substrate including a self-supporting tri-layer stack is provided. The tri-layer stack includes first and second outer layers and a biaxially oriented layer disposed between and in direct contact with the first and second outer layers. The biaxially oriented layer comprises a first polyester having greater than 45 mole percent naphthalate units and greater than 45 mole percent ethylene units. Each of the first and second outer layers comprises a second polyester comprising 40 to 50 mole percent naphthalate units, at least 25 mole percent ethylene units, and 10 to 25 mole percent of branched or cyclic C4-C10 alkyl units.

In some aspects of the present description, a substrate including a self-supporting tri-layer stack is provided. The tri-layer stack includes first and second outer layers and a biaxially oriented layer disposed between and in direct contact with the first and second outer layers. The biaxially oriented layer comprises a first polyester comprising a plurality of first monomer units and each of the first and second outer layers comprises a second polyester. The first polyester has a glass transition temperature of at least 90° C. The second polyester is a copolyester comprising a plurality of the first monomer units and a plurality of second monomer units. The second monomer units hinder crystallization of the second polyester.

In some aspects of the present description, a substrate including a self-supporting tri-layer stack is provided. The tri-layer stack includes first and second outer layers and a biaxially oriented layer disposed between and in direct contact with the first and second outer layers. Each of the first and second outer layers have an in-plane birefringence less than 0.02 and an out-of-plane birefringence less than 0.02. The biaxially oriented layer comprises a first polyester comprising a plurality of first monomer units and each of the first and second outer layers comprises a second polyester. The first polyester has a glass transition temperature of at least 90° C. The second polyester is a copolyester comprising a plurality of the first monomer units.

DETAILED DESCRIPTION

Figure 1:
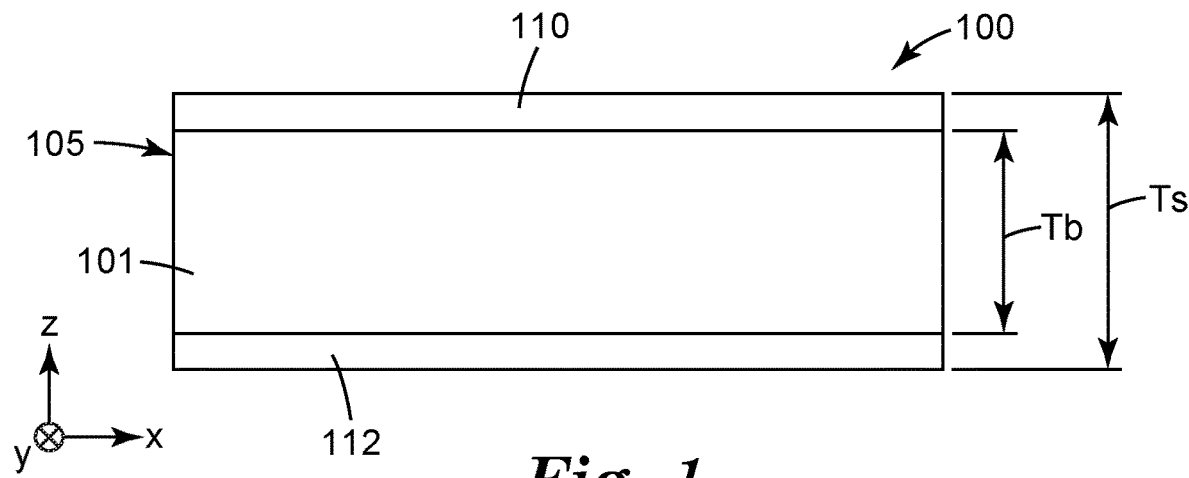
FIG. 1 is a schematic cross-sectional view of a substrate.

In the following description, reference is made to the accompanying drawings that forms a part hereof and in which various embodiments are shown by way of illustration. The drawings are not necessarily to scale. It is to be understood that other embodiments are contemplated and may be made without departing from the scope or spirit of the present disclosure. The following detailed description, therefore, is not to be taken in a limiting sense.

According to some embodiments of the present description, substrates have been developed which are easily processed via extrusion, orientation and conventional web handling techniques, and which are suitable for use in display applications and in other applications. In some embodiments, the substrates provide a high modulus and high toughness and are suitable for use in flexible display applications, for example. In some embodiments, the substrates also provide a low haze and in some cases a high UV blockage and are suitable in display applications where the substrate overlays a viewable portion of a display such as touch sensors, for example. It has been found that some polyesters can be used to provide a substrate, but that the mechanical properties of a single isolated layer of the polyester is not acceptable for many applications. In some cases, it is desired for a substrate to have a high modulus (e.g., at least 4.5 GPa) and it has been found to be difficult to provide a monolithic single layer substrate having a suitably high modulus without sacrificing other needed mechanical properties (e.g., toughness). For example, biaxially oriented polyethylene naphthalate (PEN) can be used as a high modulus substrate (e.g., Young's modulus of about 5 GPa), but a monolithic single layer of biaxially oriented PEN can be too brittle for many applications. However, according to some aspects of the present description, it has been found than PEN or other polyesters may be used in a self-supporting tri-layer stack including coPEN or other copolyesters in outer layers that are in direct contact with the PEN or other polyester layer where the tri-layer stack is mechanically robust (e.g., high modulus and substantially less brittle than a monolithic biaxially oriented PEN layer of the same thickness) and can be used in flexible and/or curved display applications, for example.

In some embodiments, the substrates are made by coextrusion followed by biaxial stretching and optional heat setting. The biaxial stretching may be carried out with equal or approximately equal (e.g., within 20%, or within 10%, or within 5%) draw ratios in orthogonal first and second directions (e.g., machine direction and transverse direction). The heat setting may take place above a melting point of the copolyester of the outer layers. In some embodiments, a heat set temperature in a range of 200° C. to 240° C. or 210° C. to 230° C. is used. In some embodiments, the heat set temperature is about 220° C. It has been unexpectedly found that the isotropy of the outer layers of the substrate can be improved by heat setting and that this improved isotropy provides improved durability (e.g., toughness) of the substrate.

FIG. 1 is a schematic cross-sectional view of substrate 100 including a self-supporting tri-layer stack 105 which includes first and second outer layers 110 and 112 and a biaxially oriented layer 101 disposed between and in direct contact with the first and second outer layers 110 and 112. In some embodiments, the substrate 100 includes additional layers (e.g., one or more of a coating, an additional polymeric layer outside the ti-layer stack 105, and an adhesive layer on an outer surface of the tri-layer stack 105) and in some embodiments, the substrate 100 does not include additional layers. In some embodiments, the biaxially oriented layer 101 includes a first polyester including a plurality of first monomer units. In some embodiments, the first monomer units are naphthalate units and the first polyester further includes ethylene units. For example, in some embodiments, the first polyester includes greater than 45 mole percent naphthalate units and greater than 45 mole percent ethylene units. In some embodiments, the first polyester includes greater than 47 mole percent, or greater than 48 mole percent, or greater than 49 mole percent naphthalate units and greater than 47 mole percent, or greater than 48 mole percent, or greater than 49 mole percent ethylene units. For example, the first polyester may be polyethylene naphthalate (PEN), which may also be referred to as poly(ethylene-2,6-naphthalate) and which includes 50 mole percent naphthalate units and 50 mole percent ethylene units. Such polyesters can be made via a condensation reaction between naphthalenedicarboxylic acid and ethylene glycol. More generally, one or more diacids and one or more diols may be used to generate the first polyester. As an illustrative example, the first polyester may be a reaction product of 46 mole percent naphthalenedicarboxylic acid, 4 mole percent terephthalic acid, 49 mole percent ethylene glycol and 1 mole percent 1,4-butanediol. In some embodiments, diesters instead of diacids are used in forming the first polyester.

A self-supporting tri-layer stack is a tri-layer stack that does not require additional layers for support. A self-supporting tri-layer stack may be used as a substrate without additional layers, though a substrate may include a tri-layer stack and additional coatings or layers. Coatings and polymeric layers having a thickness less than about a micrometer, for example, are typically not self-supporting since additional layers are needed to support such thin coatings or layers. Typically, the tri-layer stacks of the present description are at least 10 micrometers thick in order to be self-supporting.

In some embodiments, each of the first and second outer layers 110 and 112 includes a second polyester, where the second polyester is a copolyester including a plurality of the first monomer units and a plurality of second monomer units. In some embodiments, the first monomer units are naphthalate units and the second monomer units are branched or cyclic C4-C10 alkyl units which may be included to hinder crystallization of the second polyester. For example, in some embodiments, the second polyester includes 40 to 50 mole percent naphthalate units, at least 25 mole percent ethylene units, and 10 to 25 mole percent of branched or cyclic C4-C10 alkyl units. The second polyester may include additional units, such as terephthalate units, for example. In some embodiments, the second polyester is a reaction product of a composition including 40 to 50 mole percent 2,6-naphthalenedicarboxylic acid or a diester of naphthalenedicarboxylic acid (e.g., dimethyl-2,6-naphthalenedicarboxylate); at least 25 mole percent ethylene glycol; and 10 to 25 mole percent of branched or cyclic C4-C10 alkyl diols, and/or up to 10 mole percent of branched or cyclic C4-C10 alkyl diacids, and/or up to 10 mole percent of branched or cyclic C4-C10 alkyl diesters. Except where indicated differently or the context clearly indicates differently, the mole percents of the diacids or diesters and the diols add to 100 mole percent. Additional components (e.g., catalysts) that do not form part of the resulting polyester are not included in these mole percents. Catalysts such as sodium acetate and/or tetrabutyl titanate can also be included in the composition. In some embodiments, the composition further includes additional diols, diacids or diesters. For example, up to 10% of dimethyl sodium-sulfoisophthalate is included in some embodiments. In some embodiments, the second polyester includes 40 to 50 mole percent, or 45 to 50 mole percent naphthalate units; 25 to 50 mole percent, or 25 to 40 mole percent ethylene units; and 10 to 25 mole percent of branched or cyclic C4-C10 alkyl units.

In some embodiments, the second polyester includes 50 mole percent naphthalate units, 25 to 40 mole percent ethylene units, and 10 to 25 mole percent of branched or cyclic C4-C10 alkyl units, where the mole percent of ethylene units and the mole percent of branched or cyclic C4-C10 alkyl units add to 50 mole percent. In some embodiments, the mole percent of ethylene units and the mole percent of branched or cyclic C4-C10 alkyl units add to less than 50 mole percent and additional units formed from one or more other glycols monomer molecules are included. Suitable glycol monomer molecules include propylene glycol; 1,4-butanediol and isomers thereof, 1,6-hexanediol; polyethylene glycol; diethylene glycol; tricyclodecanediol; and isomers thereof, norbornanediol, bicyclo-octanediol; trimethylol propane; pentaerythritol; 1,4-benzenedimethanol and isomers thereof, bisphenol A; 1,8-dihydroxy biphenyl and isomers thereof, and 1,3-bis(2-hydroxyethoxy)benzene, for example. Typically, the amount of monomer units derived from other glycol monomer molecules (i.e., different than ethylene glycol and C4-C10 alkyl glycol(s) such as neopentyl glycol or cyclohexane glycol) is no greater than 5 mole percent. In some embodiments, units derived from other glycol monomer molecules is no greater than 1 or 2 mole percent. In the absence of other glycol monomer molecules in the synthesis, copolyester polymers may, in some cases, contain about 0.5 to 3 mol % of diethylene glycol as a side reaction by-product.

In some embodiments, the second polyester includes less than 50 mole percent naphthalate units. In some embodiments, the second polyester is formed from 2,6-naphthalene dicarboxylic acid or isomers thereof in combination with one or more other (i.e., different than naphthalene dicarboxylic acid monomer and isomers thereof) carboxylate monomer molecules. For embodiments where the second polyester contains more than one type of carboxylate unit, the second polyester may be a block or random copolyester. The total amount of other carboxylate monomer molecules may range up to 10 mole percent of the copolyester. Typically, the total amount of other carboxylate monomer molecules is no greater than 8, 6, 4, 3 or 2 mole percent of the copolyester. Suitable other carboxylate monomer molecules include, for example, terephthalic acid; isophthalic acid; phthalic acid; azelaic acid; adipic acid; sebacic acid; norbornene dicarboxylic acid; bi-cyclooctane dicarboxylic acid; t-butyl isophthalic acid, tri-mellitic acid, sodium sulfonated isophthalic acid; 4,4'-biphenyl dicarboxylic acid and isomers thereof, and lower alkyl esters of these acids, such as methyl or ethyl esters. The term "lower alkyl" refers, in this context, to C1-C10, preferably C1-C4, and more preferably C1-C2 straight-chained or branched alkyl groups.

Suitable branched or cyclic C4-C10 alkyl diols include, for example, cyclohexanedimethanol, neopentyl glycol, and mixtures thereof. The corresponding branched or cyclic C4-C10 alkyl diacid or branched or cyclic C4-C10 alkyl diester may be used in place of or in addition to the branched or cyclic C4-C10 alkyl diols. For example, dimethyl 1,4-cyclohexanedicarboxylate or 1,4-cyclohexanedicarboxylic acid may be used in place of, or in place of a portion of cyclohexanedimethanol. In some embodiments, branched or cyclic C4-C10 alkyl diols are used so that the second polyester can include 50 mole percent or close to 50 mole percent naphthalate units.

It is often preferred that the composition of the second polyester of the first outer layer 110 be the same as that of the second polyester of the second outer layer 112. However, in some embodiments, the composition of the second polyester of the first outer layer 110 and the second polyester of the second outer layer 112 may differ while remaining in a similar composition range. For example, the second polyester of the first outer layer 110 and the second polyester of the second outer layer 112 may be different but may both include 40 to 50 mole percent naphthalate units, at least 25 mole percent ethylene units, and 10 to 25 mole percent of branched or cyclic C4-C10 alkyl units. In some embodiments, the second polyester of the first outer layer 110 and the second polyester of the second outer layer 112 have nominally the same composition but the compositions may differ due to ordinary manufacturing variations, for example.

In some embodiments, the second polyester includes second monomer units which hinder crystallization of the second polyester. Suitable second monomer units for this purpose include branched or cyclic C4-C10 alkyl units as described further elsewhere herein. Using second monomer units which hinder crystallization can provide first and second outer layers 110 and 112 which are amorphous or substantially amorphous and/or which are isotropic or substantially isotropic. The degree of isotropy can be characterized by the birefringence of the outer layers. The in-plane birefringence refers to nx-ny where nx and ny are the refractive indices for light having an electric field along the x- and y-axes, respectively, referring to the x-y-z coordinate system of FIG. 1 and where x- is the in-plane direction having the largest refractive index. The in-plane birefringence is therefore greater than or equal to zero. The refractive index is determined at a wavelength of 633 nm unless specified differently. The refractive index can be determined according to the test standard ASTM D542-14 "Standard Test Method for Index of Refraction of Transparent Organic Plastics". The out-of-plane birefringence refers to ½(nx+ny)−nz where nz is the refractive indices for light having an electric field along the z-axis. The out-of-plane birefringence is typically greater than or equal to zero. In some embodiments, each of the first and second outer layers has an in-plane birefringence less than 0.02 and an out-of-plane birefringence less than 0.02. In some embodiments, each of the first and second outer layers has an in-plane birefringence less than 0.01 and an out-of-plane birefringence less than 0.01. In some embodiments, the substrate is a curved and/or flexible film used in a curved and/or flexible display. If the substrate is curved, the in-plane and out-of-plane birefringence refers to the birefringence components determined relative to a plane tangent to the curve of the substrate.

The melting point of the first and/or second polyesters may be determined from differential scanning calorimetry (DSC). In some embodiments, the second polyester has a melt transition temperature less than 220° C., or less than 210° C., or less than 200° C. after induced crystallization. The crystallization can be induced by heating or stretching. In some embodiments, the melt transition temperature is determined by differential scanning calorimetry and the crystallization is induced by heating during the differential scanning calorimetry measurement. In some embodiments, the second polyester has no melting point detectable by differential scanning calorimetry. This is the case if there is no peak in the DSC curve associated with an annealing induced crystalline phase and there is no peak associated with the melting of an induced crystalline phase. In some embodiments, the melt transition temperature, if present, is greater than 150° C.

The enthalpy of fusion can be determined using differential scanning calorimetry as described in the test standard ASTM E793-06(2012) "Standard Test Method for Enthalpies of Fusion and Crystallization by Differential Scanning Calorimetry". In some embodiments, the second polyester has an enthalpy of fusion of less than 10 J/g, or less than 5 J/g, or less than 3 J/g, or less than 1 J/g. The second polyester may be described as substantially amorphous if the second polyester has no melting point detectable by differential scanning calorimetry, or has a melt transition temperature less than 220° C. after induced crystallization, or has an enthalpy of fusion of less than 10 J/g.

In some embodiments, the first polyester has a glass transition temperature of at least 100° C. In some embodiments, the second polyester has a glass transition temperature of at least 90° C. or at least 100° C. In some embodiments, each of the first and second polyesters has a glass transition temperature of at least 90° C. or at least 100° C. In some embodiments, one or both of the first and second polyesters have a glass transition temperature of less than 160° C. The glass transition temperature can be determined by differential scanning calorimetry as described in the test standard ASTM E1356-08(2014) "Standard Test Method for Assignment of the Glass Transition Temperatures by Differential Scanning Calorimetry".

Biaxially orienting a polymer layer can increase the Young's modulus of the layer. In some embodiments, the Young's modulus of the biaxially oriented layer 101 is at least 4.5 GPa, or at least 5 GPa. In some embodiments, the Young's modulus of the biaxially oriented layer 101 is no more than 15 GPa, or no more than 10 GPa. The Young's modulus is determined at 25° C. unless indicated differently. The Young's modulus can be determined as described in the test standard ASTM E111-04(2010) "Standard Test Method for Young's Modulus, Tangent Modulus, and Chord Modulus". Biaxially orienting a polymer layer can result in a relatively low in-plane birefringence and a relatively high out-of-plane birefringence. In some embodiments, the biaxially oriented layer 101 has an in-plane birefringence of less than 0.1, or less than 0.05, or less than 0.03, or less than 0.02, or less than 0.01. In some embodiments, the biaxially oriented layer 101 has an out-of-plane birefringence of at least 0.18, or at least 0.2.

In some embodiments, the tri-layer stack 105 has a thickness Ts in a range of 10 micrometers, or 20 micrometers, or 25 micrometers, to 200 micrometers or 125 micrometers. In some embodiments, the thickness Tb of the biaxially oriented layer 101 is at least 80 percent, or at least 90 percent of the thickness Ts of the tri-layer stack 105. In some embodiments, the thickness Tb of the biaxially oriented layer 101 is no more than 99 percent of the thickness Ts of the tri-layer stack 100. Using thicknesses and thickness ratios in these ranges have been found to provide desired mechanical properties for a desired overall thickness Ts of the tri-layer stack 105. In some embodiments, the substrate 100 does not include any additional layers and has a total thickness of Ts. In other embodiments, the substrate 100 may include additional layers and so may have a total thickness greater than Ts.

It has been found that using a common first monomer unit (e.g., naphthalate units) for the first and second polyesters can result in better delamination performance (separation of an outer layer 110 and/or 112) from the biaxially oriented layer 101 compared to using first and second polyesters that do not share a common first monomer unit. Without intending to be limited by theory, it is believed that this occurs in the absence of chemical bonds between the outer layers 110, 112 and the biaxially oriented layer 101 due to the similarity in the coefficient of thermal expansion of the layers.

In some embodiments, an additional coating or layer is applied to an outer surface of one or both of the outer layers 110 and 112. In some embodiments, an outer surface of one or both of the outer layers 110 and 112 is optically smooth. That is, any surface roughness present may have a peak to valley height small compared to a wavelength of visible light (e.g., small compared to 550 nm). In some embodiments, an outer surface has a surface roughness Ra of less than 100 nm, or less than 50 nm, or less than 20 nm, or even less than 10 nm. Ra refers to an arithmetic average of absolute values of differences between a surface height and an average surface position. Ra may be determined according to the American Society of Mechanical Engineers (ASME) B46.1-2009 test standard.

It may be desired for the substrate 100 to have a low haze so that the substrate does not degrade an image quality when used in a display in a position where light produced by the display is transmitted through the substrate 100, for example. In some embodiments, the substrate 100 has a haze of less than 2 percent, or less than 1 percent. Such low hazes can be obtained using the polyester compositions described elsewhere herein. Haze can be determined according to the test standard ASTM D1003-13 "Standard Test Method for Haze and Luminous Transmittance of Transparent Plastics".

It may be desired for the substrate to block ultraviolet radiation in order to protect other layers included in a display, for example. Utilizing naphthalate monomer units in the first polyester (e.g., utilizing PEN) can provide a desired degree of absorption in the ultraviolet. Whether naphthalate monomer units or other monomer units are utilized, it may be desired to include one or more ultraviolet absorbers in one or both of the first and second polyesters to increase the ultraviolet absorption of the substrate 100. Suitable ultraviolet absorbers include triazines, benzotriazoles, and benzophenones, for example.

The polyesters described herein may be used in other applications such as in retarder films as described in U.S. Prov. Pat. Appl. No. 62/592,545, titled "Retarder", filed on Nov. 30, 2017, and incorporated herein by reference to the extent that it does not contradict the present description.

Figure 2:
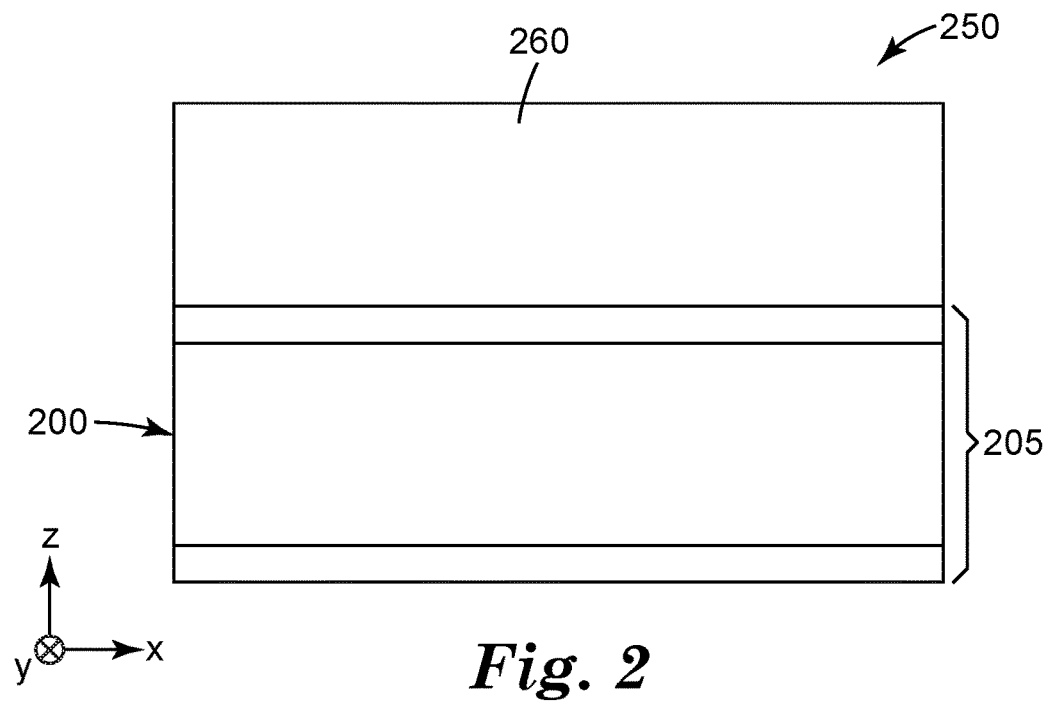
FIG. 2 is a schematic illustration of a display including an emissive layer and a substrate.

FIG. 2 is a schematic illustration of a display 250 including an emissive layer 260 and a substrate 200. The substrate 200 may be any substrate described elsewhere herein. For example, substrate 200 and tri-layer stack 205 may correspond to substrate 100 and tri-layer stack 105, respectively. Emissive layer 260 may be a display panel such as a liquid crystal display (LCD) panel or an organic light emitting diode (OLED) display panel, or emissive layer 260 may be a component of a display panel. For example, emissive layer 260 may be the emissive layer of an OLED display panel. Light is emitted by the emissive layer 260 in the z-direction referring to the x-y-z coordinate system of FIG. 2. In some embodiments, the substrate 200 is positioned opposite a light output direction of the emissive layer 260. In some embodiments, a substrate of the present description is positioned to receive light from the emissive layer 260. In some embodiments, the substrate 200 is separated from the emissive layer 260 and in some embodiments, the substrate 200 is attached directly or indirectly (e.g., through one or more additional layers) to the emissive layer 260 (e.g., via an optically clear adhesive). In some embodiments, the display 250 may include additional layers or components not illustrated in FIG. 2. For example, a touch sensor may be disposed proximate the emissive layer 260 opposite the substrate 200. The touch sensor may include one or more substrates of the present description.

Figure 3:
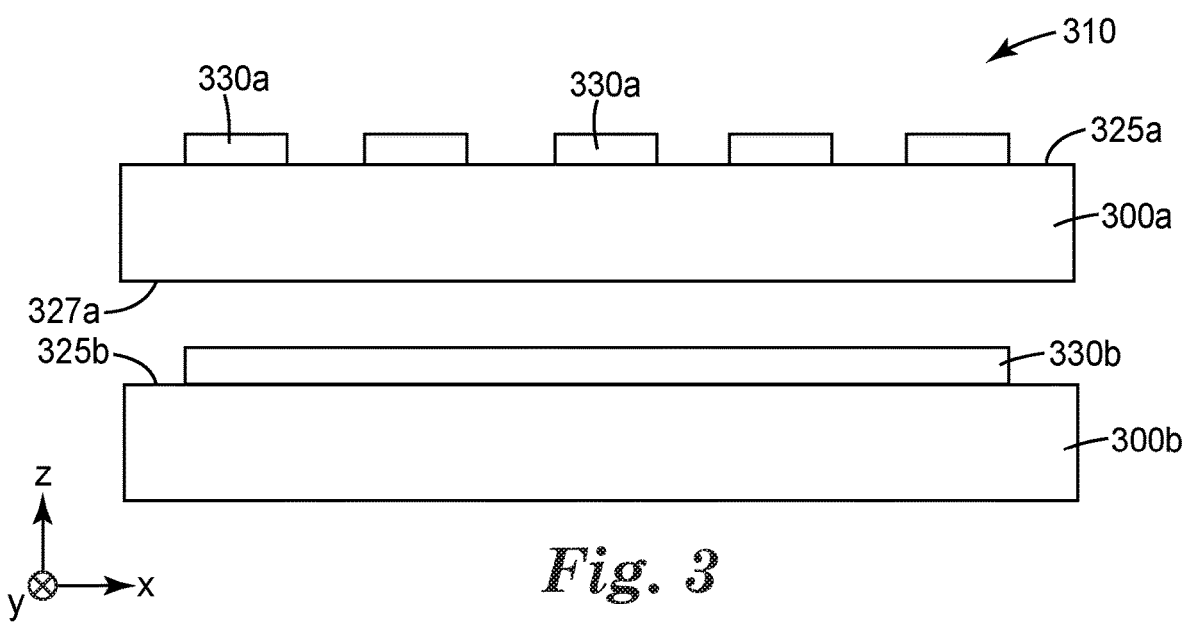
FIG. 3 is a schematic cross-sectional view of a touch sensor.

FIG. 3 is a schematic cross-sectional view of touch sensor 310 including a first substrate 300a having a first plurality of electrodes 330a disposed on a first major surface 325a of the first substrate 300a. Touch sensor 310 also includes a second substrate 300b having a second plurality of electrodes 330b (only one of the electrodes 330b is visible in the cross-section of FIG. 3) disposed on a first major surface 325b of the second substrate 300b. The first plurality of electrodes 330a may extend along a first direction (e.g., the y-direction, referring to the x-y-z coordinate system depicted in FIG. 3) and the second plurality of electrodes 330b may extend along an orthogonal second direction (e.g., the x-direction) so that the first and second pluralities of electrodes 330a and 330b form a crossed grid of electrodes as is conventionally used in touch sensors. In alternative embodiments, the second substrate 300b is omitted and the second plurality of electrodes 330b are disposed on a second major surface 327a of the first substrate 300a. First substrate 300a may correspond to substrate 100 and may include a three-layer stack (not shown in FIG. 3) as described further elsewhere herein, for example. Similarly, second substrate 300b may correspond to substrate 100 and may include a three-layer stack (not shown in FIG. 3) as described further elsewhere herein, for example. In some embodiments, both of the first and second substrates 300a and 300b correspond to substrate 100, while in other embodiments, only one of the first and second substrates 300a and 300b corresponds to substrate 100.

The first and/or second plurality of electrodes may be any type of electrodes suitable for use in touch sensors. Examples include transparent conductor electrodes (e.g., indium tin oxide (ITO)) and metallic mesh electrodes such as those described in U.S. Pat. No. 8,933,906 (Frey) which is hereby incorporated herein by reference to the extent that it does not contradict the present description. Electrodes can be deposited onto a substrate by utilizing sputtering or etching processes as is known in the art. Other useful touch sensors, and methods of making the touch sensors, that can utilize the substrates of the present description are described in U.S. Pat. No. 8,384,961 (Frey et al.), U.S. Pat. No. 8,865,027 (Alden et al.), and U.S. Pat. No. 9,023,229 (Sebastian et al.) and in U.S. Pat. App. No. 2015/316955 (Dodds et al.), each of which are incorporated herein by reference to the extent that it does not contradict the present description.

In some embodiments, the touch sensor 310 is placed over a display so that light emitted from the display is transmitted through the touch sensor 310. For example, the touch sensor 310 may be placed over the display 250

Figure 4:
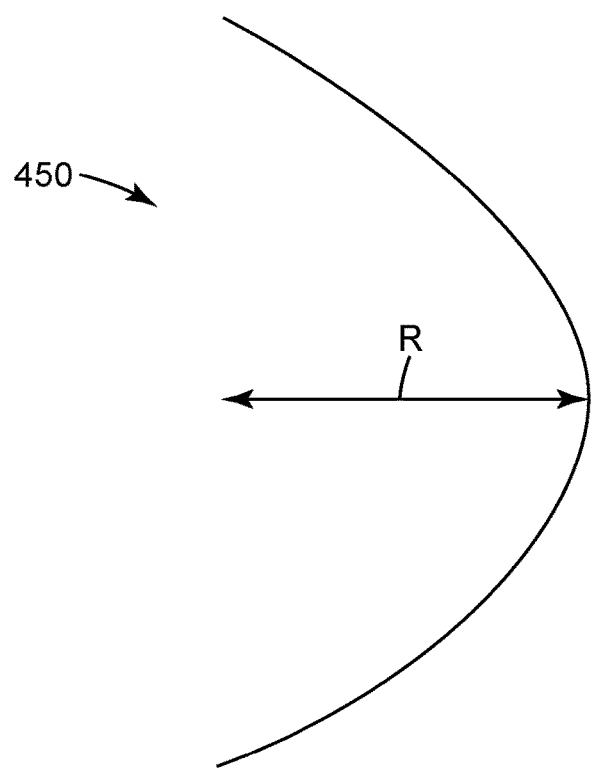
FIG. 4 is a schematic cross-sectional view of a curved display.

In some embodiments, a display including one or more substrates of the present description is flexible and/or curved. FIG. 4 is a schematic cross-sectional view of a display 450 curved to a radius of curvature R. The display 450, which is schematically illustrated by a solid curve, includes at least one substrate of the present description. In some embodiments, the display 450 is bendable to a radius of curvature R of 20 cm without visible damage, which should be understood to mean without damage visible to a person with 20/20 vision with no vision aids in ordinary room lighting with the display on or off. The display may be bendable to smaller radius of curvature (e.g., to a radius of curvature R of 10 cm) without visible damage. In some embodiments, the display can be bent from flat to a radius of curvature R of 20 cm and back to flat at least 100 times without visible damage.

The following is a list of exemplary embodiments of the present description.

Embodiment 1 is a substrate comprising a self-supporting tri-layer stack, the tri-layer stack comprising first and second outer layers and a biaxially oriented layer disposed between and in direct contact with the first and second outer layers, wherein the biaxially oriented layer comprises a first polyester having greater than 45 mole percent naphthalate units and greater than 45 mole percent ethylene units, wherein each of the first and second outer layers comprises a second polyester comprising 40 to 50 mole percent naphthalate units, at least 25 mole percent ethylene units, and 10 to 25 mole percent of branched or cyclic C4-C10 alkyl units.

Embodiment 2 is the substrate of Embodiment 1, wherein the biaxially oriented layer has a Young's modulus of at least 4.5 GPa.

Embodiment 3 is the substrate of Embodiment 1 or 2, wherein the biaxially oriented layer has an out-of-plane birefringence of at least 0.18, or at least 0.2.

Embodiment 4 is the substrate of any one of Embodiments 1 to 3, wherein the tri-layer stack has a thickness in a range of 10 micrometers to 200 micrometers, or 20 micrometers to 200 micrometers, or 25 micrometers to 125 micrometers.

Embodiment 5 is the substrate of any one of Embodiments 1 to 4, wherein a thickness of the biaxially oriented layer is at least 80 percent or at least 90 percent of a thickness of the tri-layer stack.

Embodiment 6 is the substrate of any one of Embodiments 1 to 5, wherein the second polyester is substantially amorphous.

Embodiment 7 is the substrate of any one of Embodiments 1 to 6, wherein the second polyester has no melting point detectable by differential scanning calorimetry.

Embodiment 8 is the substrate of any one of Embodiments 1 to 6, wherein the second polyester has a melt transition temperature less than 220° C. after induced crystallization.

Embodiment 9 is the substrate of any one of Embodiments 1 to 6, wherein the second polyester has an enthalpy of fusion of less than 10 J/g, or less than 5 J/g, or less than 3 J/g.

Embodiment 10 is the substrate of any one of Embodiments 1 to 9, wherein the first and second outer layers each have an in-plane birefringence of less than 0.02 and an out-of-plane birefringence of less than 0.02.

Embodiment 11 is the substrate of any one of Embodiments 1 to 9, wherein the first and second outer layers each have an in-plane birefringence of less than 0.01 and an out-of-plane birefringence of less than 0.01.

Embodiment 12 is the substrate of any one of Embodiments 1 to 11, wherein the second polyester comprises 25 to 50 mole percent ethylene units or 25 to 40 mole percent ethylene units.

Embodiment 13 is the substrate of any one of Embodiments 1 to 12, wherein the first polyester is polyethylene naphthalate (PEN).

Embodiment 14 is the substrate of any one of Embodiments 1 to 13, wherein the mole percent naphthalate units, the mole percent ethylene units, and the mole percent of branched or cyclic C4-C10 alkyl units add to 100 mole percent for the second polyester, and the mole percent naphthalate units and the mole percent ethylene units add to 100 mole percent for the first polyester.

Embodiment 15 is the substrate of any one of Embodiments 1 to 14 having a haze of less than 2 percent, or less than 1 percent.

Embodiment 16 is a substrate comprising a self-supporting tri-layer stack, the tri-layer stack comprising first and second outer layers and a biaxially oriented layer disposed between and in direct contact with the first and second outer layers, wherein the biaxially oriented layer comprises a first polyester comprising a plurality of first monomer units and each of the first and second outer layers comprises a second polyester, the first polyester having a glass transition temperature of at least 90° C., the second polyester being a copolyester comprising a plurality of the first monomer units and a plurality of second monomer units, the second monomer units hindering crystallization of the second polyester.

Embodiment 17 is the substrate of Embodiment 16, wherein the first and second outer layers each have an in-plane birefringence of less than 0.02 and an out-of-plane birefringence of less than 0.02.

Embodiment 18 is the substrate of Embodiment 16 or 17, wherein the first monomer units are naphthalate units.

Embodiment 19 is the substrate of any one of Embodiments 16 to 18, wherein the first polymer further comprises ethylene units.

Embodiment 20 is the substrate of any one of Embodiments 16 to 19, wherein the second monomer units are branched or cyclic C4-C10 alkyl units.

Embodiment 21 is the substrate of any one of Embodiments 16 to 20, wherein the first polyester comprises greater than 45 mole percent naphthalate units and greater than 45 mole percent ethylene units.

Embodiment 22 is the substrate of any one of Embodiments 16 to 21, wherein the second polyester comprises 40 to 50 mole percent naphthalate units, at least 25 mole percent ethylene units, and 10 to 25 mole percent of branched or cyclic C4-C10 alkyl units.

Embodiment 23 is the substrate of Embodiment 22, wherein the second polyester comprises 25 to 50 mole percent ethylene units or 25 to 40 mole percent ethylene units.

Embodiment 24 is a substrate comprising a self-supporting tri-layer stack, the tri-layer stack comprising first and second outer layers and a biaxially oriented layer disposed between and in direct contact with the first and second outer layers, each of the first and second outer layers having an in-plane birefringence less than 0.02 and an out-of-plane birefringence less than 0.02, wherein the biaxially oriented layer comprises a first polyester comprising a plurality of first monomer units and each of the first and second outer layers comprises a second polyester, the first polyester having a glass transition temperature of at least 90° C., the second polyester being a copolyester comprising a plurality of the first monomer units.

Embodiment 25 is the substrate of Embodiment 24, wherein the second polyester comprises a plurality of second monomer units hindering crystallization of the second polyester.

Embodiment 26 is the substrate of Embodiment 25, wherein the second monomer units comprise cyclic C4-C10 alkyl units.

Embodiment 27 is the substrate of any one of Embodiments 24 to 26, wherein the first monomer units are naphthalate units.

Embodiment 28 is the substrate of any one of Embodiments 24 to 27, wherein the first polyester comprises greater than 45 mole percent naphthalate units and greater than 45 mole percent ethylene units.

Embodiment 29 is the substrate of any one of Embodiments 24 to 28, wherein the second polyester comprises 40 to 50 mole percent naphthalate units, at least 25 mole percent ethylene units, and 10 to 25 mole percent of branched or cyclic C4-C10 alkyl units.

Embodiment 30 is the substrate of any one of Embodiments 24 to 29, wherein the second polyester comprises 25 to 50 mole percent ethylene units or 25 to 40 mole percent ethylene units.

Embodiment 31 is the substrate of any one of Embodiments 16 to 30, further characterized according to any one of Embodiments 1 to 15.

Embodiment 32 is the substrate of any one of Embodiments 1 to 31, wherein the first polyester has a glass transition temperature of at least 100° C.

Embodiment 33 is the substrate of any one of Embodiments 1 to 32, wherein each of the first and second polyesters has a glass transition temperature of at least 90° C., or at least 100° C.

Embodiment 34 is a display comprising an emissive layer disposed on the substrate of any one of Embodiments 1 to 33.

Embodiment 35 is the display of Embodiment 34 being bendable to a radius of curvature of 20 cm without visible damage.

Embodiment 36 is the display of Embodiment 34 or 35 being curved.

Embodiment 37 is a touch sensor comprising the substrate of any one of Embodiments 1 to 33 and a plurality of electrodes disposed on the substrate.

Embodiment 38 is a display comprising the touch sensor of Embodiment 37.

EXAMPLES

Examples 1-3 and Comparative Examples C1-C3: Copolyester Manufacture and Characterization A series of polyester copolymers were produced using the following procedure:
To a stainless steel 10-gallon reactor at room temperature, equipped with hot oil temperature control, an overhead separation column, and a vacuum pump, the following components were added.
Dimethyl-2,6-Naphthalene Dicarboxylate (NDC)
  (obtained from Indorama Ventures, Decatur, Ala.)
Ethylene Glycol (EG)
  (obtained from Huntsman Petrochemical, The Woodlands, Tex.)
Cyclohexanedimethanol (CHDM)
  (obtained from Eastman Chemical, Kingsport, Tenn.)
Tetrabutyl Titanate (TBT)
  (obtained from Dorf Ketal, Houston, Tex.)
Cobalt Acetate (CoAc)
  (obtained from Shepherd Chemical, Cincinnati, Ohio)
Zinc Acetate (ZnAc)
  (obtained from Mallinckrodt Baker, Phillipsburg, N.J.)
Antimony Triacetate (SbAc)
  (obtained from Arkema, Philadelphia, Pa.)
Table 1, below, provides the amounts used for each component in each Example and Comparative Example. Once added, these materials were heated and mixed at 125 rpm under 138 kPa (20 psig) of N2. The transesterification reaction temperature was raised over the course of about 2 hours to 257° C. (495° F.). Methanol was driven off through the separation column and collected in a receiver. The pressure in the kettle was slowly bled down to atmospheric. In the case of Comparative Examples C1 and C2, a stabilizer was added. That stabilizer was Triethylphosphonoacetate (TEPA) (obtained from Rhodia, Cranbury, N.J.).

For the Examples, vacuum was applied to the kettle and increased as batch viscosity allowed. Excess ethylene glycol was driven off. After about 2 hours at a temp of about 285° C. (545° F.) and a vacuum as low as about 0.13 kPa (1 mmHg), the reaction progressed to the desired endpoint (Intrinsic viscosity, or IV, of about 0.48 dL/g). The kettle was drained and the reaction product resin was cooled to room temperature, then the resin was ground up into small pieces for further evaluation. Table 1 provides the amounts used for each component in each Example and Comparative Example. The % CHDM of the materials in the Title row refer to the mole % of CHDM in the diols portion of the polyester. For example, PEN w/30% CHDM means that diol portion of the polyester contains 30 mole % CHDM. Based on the total diol and acid/esters, PEN w/30% CHDM contains 50 mole percent naphthalate units, 35 mole percent ethylene units, and 15 mole percent CHDM units.

TABLE 1

| | Example | | | | | |
|---|---|---|---|---|---|---|
| Title | 1 PEN w/30% CHDM | 2 PEN w/40% CHDM | 3 PEN w/50% CHDM | C1 PEN w/10% CHDM | C2 PEN w/15% CHDM | C3 PEN w/60% CHDM |
| Acids/Esters (kg) | | | | | | |
| NDC | 18.61 | 17.72 | 16.81 | 17.64 | 17.42 | 16.08 |
| Diols (kg) | | | | | | |
| EG | 9.462 | 8.559 | 7.693 | 9.435 | 9.072 | 6.949 |
| CHDM | 3.298 | 4.187 | 4.967 | 1.012 | 1.501 | 5.697 |
| Catalysts (g) | | | | | | |
| TBT | 1.86 | 1.77 | 1.68 | | | 1.61 |
| CoAc | | | | 2.0 | 2.0 | |
| ZnAc | | | | 1.6 | 1.6 | |
| SbAc | | | | 8.9 | 8.9 | |
| Stabilizer (g) | | | | | | |
| TEPA | | | | 3.6 | 3.6 | |

A specimen of the resin of each Example and Comparative Example were then placed in an oven maintained at 150° C., for 48 hours, for cold crystallization. Each of these crystallized materials was tested using a Differential Scanning Calorimeter, or DSC (obtained under the trade designation "Q2000" from TA Instruments, New Castle, Del.). The test employed a 3-stage heating-cooling-heating temperature ramp in a temperature range of 30° C. to 290° C. The specimen was held at 290° C. for 3 minutes after the first heating ramp. The ramp rate was 20° C./min for each of the heating and cooling ramps. Both the first heating scan and the second heating scan were analyzed. Melt point and the associated melting enthalpy, and the glass transition temperature, were determined for each test specimen, and recorded. Table 2 presents the findings for melt point and associated melting enthalpy ($\Delta H$), and for glass transition (Tg).

TABLE 2

| | Example | | | | | |
|---|---|---|---|---|---|---|
| Title | 1 PEN w/30% CHDM | 2 PEN w/40% CHDM | 3 PEN w/50% CHDM | C1 PEN w/10% CHDM | C2 PEN w/15% CHDM | C3 PEN w/60% CHDM |
| Melt Point (° C.) | 194 | not detected | 209 | 245 | 237 | 246 |
| $\Delta H$ (J/g) | 0.17 | 0 | 2.4 | 30 | 22 | 13.4 |

TABLE 2-continued

| | Example | | | | | |
|---|---|---|---|---|---|---|
| Title | 1 PEN w/30% CHDM | 2 PEN w/40% CHDM | 3 PEN w/50% CHDM | C1 PEN w/10% CHDM | C2 PEN w/15% CHDM | C3 PEN w/60% CHDM |
| Tg (° C.) | 118 | 117 | 116 | 119 | 118 | 117 |
| Resin Name | PENg30 | PENg40 | PENg50 | PENg10 | PENg15 | PENg60 |

As can be seen from Table 2, Examples 1, 2 and 3, (PENg30, PENg40 and PENg50 respectively), exhibited melt points of 210° C. or lower with little to no melting enthalpy (less than 3 J/g). The Tg's of all the specimens were found to be between 115° C. and 120° C.

Examples 4-8 and Comparative Examples C4-C6: Film Manufacture and Characterization A series of 3 layer films was produced via co-extrusion, stretch co-orientation and annealing.

The resins used as input materials were as follows:
PEN Refers to a 0.48 IV Polyethylene Naphthalate Resin
  (made in-house by methods known to one of ordinary skill in the art of polyester manufacture)
PETg Refers to a 0.73 IV Copolyester
  (obtained under the trade designation "GN071" from Eastman Corporation, Kingsport, Tenn.)
PENg30, PENg40, PENg50 and PENg60
  (materials described above in Examples 1, 2, and 3 and Comparative Example C3, respectively) The details of the input materials for the layers of the ABA film stack are provided in Table 3 for each of these Examples.

TABLE 3

| Example No. | "B"Layer Core Resin | Feed Rate, Core Layer (kg/hr) | "A" Layer Skin Resin | Feed Rate, Skin Layers (kg/hr) |
|---|---|---|---|---|
| C4 | PEN | 9.1 | PEN | 4.5 |
| C5 | PEN | 9.1 | PETG | 4.5 |
| C6 | PEN | 11.3 | PENg60 | 2.3 |
| 4 | PEN | 11.3 | PENg30 | 2.3 |
| 5 | PEN | 11.3 | PENg50 | 2.3 |
| 6 | PEN | 11.3 | PENg40 | 2.3 |
| 7 | PEN | 9.1 | PENg30 | 4.5 |
| 8 | PEN | 9.1 | PENg40 | 4.5 |

The outer layers (or skin layers, or "A" layers) were produced by extruding the above-identified resins using a 27 mm Twin-Screw Extruder (TSE), conveying via a neck tube using a gear pump, and feeding into the outer layers of a 3-layer feed block. This melt train used a progressive temperature extrusion profile, with a peak temperature of 282° C. The inner layer (or core layer, or "B" layer) was produced by extruding PEN resin using a 27 mm TSE with a progressive temperature profile peaking at about 282° C., conveying via a neck tube using a gear pump, and feeding into the middle layer of a 3-layer feed block. The feed block and 20.3 cm (8 inch) film die were each maintained at a target temperature of 282° C. while the film casting wheel was maintained at about 50° C. Film cast webs of 914 microns (36 mils) thickness were produced by this process.

Specimens from each of the cast webs produced from the extrusion and casting process were then stretched (oriented) and annealed using a laboratory stretching machine (obtained under the trade designation "KARO IV" from Brueckner Maschinenbau GmbH & Co. KG, Siegsdorf, Germany). Stretching of each film occurred in an oven maintained at 140° C. Preheat time prior to stretch was 45 seconds. Each film was stretched biaxially to a final dimension 350% of original size in the machine direction (MD) and 350% of original size in the transverse direction (TD), resulting in a 76 micron (3 mil) finished film. A stretched film was then conveyed into an annealing oven maintained at 225° C. and held there, restrained, for 15 seconds. Each stretch-oriented, annealed film was then evaluated for haze, refractive index, delamination peel force, and Graves tear.

Haze was tested using ahaze meter (obtained under the trade designation "HAZE-GARD" from BYK-Gardner USA, Columbia, Md.). Haze was measured according to ASTM D-1003, and is reported as "% Haze".

The refractive indices of the film specimens were measured using a prism coupler (obtained from Metricon Corporation, Pennington, N.J.) in the machine direction (MD), transverse direction (TD) and thickness (TM) directions. The refractive indices of MD, TD and TM are labeled Nx, Ny and Nz respectively. Out-of-plane Birefringence represents the difference between the average in-plane index, that is, the average of Nx and Ny, and the index normal to the film (Nz).

Graves Max Load and Graves Area values were obtained according to ASTM D1004-13 on an Instron 5500-R from Instron, Norwood, Mass.

Delamination Peel Force Testing values were obtained using an IMASS SP-2100 from IMASS, Inc., Accord, Mass., with the base film taped to a rigid flat glass plate. The peel force measurement was taken as follows: 90 degree peel; 60 inches/minute slide speed; and the peel force was averaged over the travel distance of the peel. The resulting peel force values, given ingrams/inch, were recorded.

The results of these tests are reported in Table 4.

TABLE 4

| Example No. | "B"Layer Core Resin | Feed Rate, Core Layer (kg/hr) | "A" Layer Skin Resin | Feed Rate, Skin Layers (kg/hr) | % Haze (3 mil film) | Avg In-Plane Index (Skin Layers) | Out-of-Plane Index (Skin Layers) | Out-of-Plane Birefringence (Skin Layers) | Peel Force (g/in) | Graves Max Load ($lb_f$) | Graves Area ($lb_f$* %) |
|---|---|---|---|---|---|---|---|---|---|---|---|
| C4 | PEN | 9.1 | PEN | 4.5 | 0.48 | 1.746 | 1.494 | 0.252 | Inseparable | 5.4 | 20.0 |
| C5 | PEN | 9.1 | PETG | 4.5 | 0.37 | 1.565 | 1.563 | 0.002 | 279.0 | 4.6 | 19.0 |
| C6 | PEN | 11.3 | PENg60 | 2.3 | 0.44 | 1.644 | 1.586 | 0.058 | Inseparable | 4.4 | 13.5 |
| 4 | PEN | 11.3 | PENg30 | 2.3 | 0.35 | 1.628 | 1.622 | 0.006 | Inseparable | 5.4 | 25.5 |
| 5 | PEN | 11.3 | PENg50 | 2.3 | 0.33 | 1.62 | 1.614 | 0.006 | Inseparable | 4.6 | 17.5 |
| 6 | PEN | 11.3 | PENg40 | 2.3 | 0.73 | 1.624 | 1.620 | 0.004 | Inseparable | 5.0 | 20.5 |
| 7 | PEN | 9.1 | PENg30 | 4.5 | 0.41 | 1.629 | 1.624 | 0.005 | Inseparable | 4.9 | 19.0 |
| 8 | PEN | 9.1 | PENg40 | 4.5 | 0.69 | 1.626 | 1.620 | 0.006 | Inseparable | 4.6 | 17.0 |

Each of the Examples and Comparative Examples provided a low haze film (less than 1% haze). Each of Comparative Example C5 and Examples 4 through 8 demonstrated a low out-of-plane birefringence (less than 0.01), which may be indicative of the desired amorphous (coating receptive and flexible) surfaces for these films. Also, each of these films exhibited less than 5% transmission at 375 nm.

With the exception of Comparative Example C5, each film exhibited high delamination peel performance (that is, they were impossible to peel apart by this test, or "inseparable"). With the exception of Comparative Example C6, all samples exhibited excellent Graves Tear (maximum load greater than 20 Newtons (4.5 $lb_f$) and Graves Area greater than 62 Newtons*% (14 $lb_f$*%).

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A substrate comprising a self-supporting tri-layer stack, the self-supporting tri-layer stack having a thickness in a range of 10 micrometers to 200 micrometers and comprising first and second outer layers and a biaxially oriented layer disposed between and in direct contact with the first and second outer layers, wherein the biaxially oriented layer comprises a first polyester having greater than 45 mole percent naphthalate units and greater than 45 mole percent ethylene units, wherein each of the first and second outer layers comprises a second polyester comprising 40 to 50 mole percent naphthalate units, at least 25 mole percent ethylene units, and 10 to 25 mole percent of branched or cyclic C4-C10 alkyl units, wherein the second polyester comprises no more than 2 mole percent of any carboxylate units other than naphthalate units, wherein the second polyester has a glass transition temperature between 115° C. and 120° C., and wherein the mole percent naphthalate units, the mole percent ethylene units, and the mole percent of branched or cyclic C4-C10 alkyl units add to 100 mole percent for the second polyester, and the mole percent naphthalate units and the mole percent ethylene units add to 100 mole percent for the first polyester.

2. The substrate of claim 1, wherein the biaxially oriented layer has a Young's modulus of at least 4.5 GPa.

3. The substrate of claim 1, wherein the biaxially oriented layer has an out-of-plane birefringence of at least 0.18.

4. The substrate of claim 1, wherein a thickness of the biaxially oriented layer is at least 80 percent of the thickness of the tri-layer stack.

5. The substrate of claim 1, wherein the second polyester has no melting point detectable by differential scanning calorimetry.

6. The substrate of claim 1, wherein the second polyester has an enthalpy of fusion of less than 10 J/g.

7. The substrate of claim 1, wherein the first and second outer layers each have an in-plane birefringence of less than 0.02 and an out-of-plane birefringence of less than 0.02.

8. The substrate of claim 1 having a haze of less than 2 percent.

9. The substrate of claim 1, wherein the biaxially oriented layer has an out-of-plane birefringence of at least 0.18, wherein the first and second outer layers each have an in-plane birefringence of less than 0.02 and an out-of-plane birefringence of less than 0.02, and wherein a thickness of the biaxially oriented layer is at least 80 percent of the thickness of the tri-layer stack.

10. A display comprising an emissive layer disposed on a substrate, the substrate comprising a self-supporting tri-layer stack, the self-supporting tri-layer stack having a thickness in a range of 10 micrometers to 200 micrometers and comprising first and second outer layers and a biaxially oriented layer disposed between and in direct contact with the first and second outer layers, wherein the biaxially oriented layer comprises a first polyester having greater than 45 mole percent naphthalate units and greater than 45 mole percent ethylene units, wherein each of the first and second outer layers comprises a second polyester comprising 40 to 50 mole percent naphthalate units, at least 25 mole percent ethylene units, and 10 to 25 mole percent of branched or cyclic C4-C10 alkyl units, wherein the second polyester comprises no more than 2 mole percent of any carboxylate units other than naphthalate units, wherein the second polyester has a glass transition temperature between 115° C. and 120° C.

11. The display of claim 10 being bendable to a radius of curvature of 20 cm without visible damage.

12. The display of claim 10, wherein the biaxially oriented layer has a Young's modulus of at least 4.5 GPa.

13. The display of claim 10, wherein the biaxially oriented layer has an out-of-plane birefringence of at least 0.18, and wherein the first and second outer layers each have an in-plane birefringence of less than 0.02 and an out-of-plane birefringence of less than 0.02.

14. The display of claim 10, wherein a thickness of the biaxially oriented layer is at least 80 percent of the thickness of the tri-layer stack.

15. The display of claim 10, wherein the second polyester has no melting point detectable by differential scanning calorimetry.

16. A touch sensor comprising a substrate and a plurality of electrodes disposed on the substrate, the substrate comprising a self-supporting tri-layer stack, the self-supporting tri-layer stack having a thickness in a range of 10 micrometers to 200 micrometers and comprising first and second outer layers and a biaxially oriented layer disposed between and in direct contact with the first and second outer layers, wherein the biaxially oriented layer comprises a first polyester having greater than 45 mole percent naphthalate units and greater than 45 mole percent ethylene units, wherein each of the first and second outer layers comprises a second polyester comprising 40 to 50 mole percent naphthalate units, at least 25 mole percent ethylene units, and 10 to 25 mole percent of branched or cyclic C4-C10 alkyl units, wherein the second polyester comprises no more than 2 mole percent of any carboxylate units other than naphthalate units, wherein the second polyester has a glass transition temperature between 115° C. and 120° C.

17. The touch sensor of claim 16, wherein the biaxially oriented layer has a Young's modulus of at least 4.5 GPa.

18. The touch sensor of claim 16, wherein the biaxially oriented layer has an out-of-plane birefringence of at least 0.18, and wherein the first and second outer layers each have an in-plane birefringence of less than 0.02 and an out-of-plane birefringence of less than 0.02.

19. The touch sensor of claim 16, wherein a thickness of the biaxially oriented layer is at least 80 percent of the thickness of the tri-layer stack.

20. The touch sensor of claim 16, wherein the second polyester has no melting point detectable by differential scanning calorimetry.

* * * * *